United States Patent
Kim

(10) Patent No.: US 8,106,698 B2
(45) Date of Patent: Jan. 31, 2012

(54) PULSE-BASED FLIP-FLOP HAVING SCAN INPUT SIGNAL

(75) Inventor: Min-Su Kim, Hwaseong-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 348 days.

(21) Appl. No.: 12/405,850

(22) Filed: Mar. 17, 2009

(65) Prior Publication Data
US 2009/0237136 A1 Sep. 24, 2009

(30) Foreign Application Priority Data
Mar. 18, 2008 (KR) .......... 10-2008-0024895

(51) Int. Cl.
*H03K 3/356* (2006.01)
(52) U.S. Cl. ........ 327/208; 327/199; 327/211; 327/212; 327/218
(58) Field of Classification Search .................. 327/199, 327/202, 203, 208, 210–215, 218, 219
See application file for complete search history.

(56) References Cited

U.S. PATENT DOCUMENTS
7,332,949 B2 * 2/2008 Kim .............................. 327/202
7,816,964 B2 * 10/2010 Kim .............................. 327/218

FOREIGN PATENT DOCUMENTS
| JP | 2007-028532 | 2/2007 |
| KR | 1020050109365 | 11/2005 |
| KR | 1020050112972 | 12/2005 |

OTHER PUBLICATIONS
English Abstract for Publication No. 1020050112972.
English Abstract for Publication No. 1020050109365.
English Abstract for Publication No. 2007-028532.

* cited by examiner

*Primary Examiner* — Long Nguyen
(74) *Attorney, Agent, or Firm* — F. Chau & Associates, LLC

(57) ABSTRACT

A flip-flop for transmitting a scan input and data for scan-testing a semiconductor circuit is provided. The flip-flop includes a first pulse signal generator which generates a first pulse signal in response to a scan enable signal and an inversed scan input signal. A second pulse signal generator generates a second pulse signal in response to the scan enable signal and a scan input signal. A signal transmitter receives a data signal and transmits the data signal to a first node in response to either one of the first and second pulse signals. A signal latch unit receives the data signal transmitted to the first node, and latches and outputs the data signal in response to another one of the first and second pulse signals.

20 Claims, 9 Drawing Sheets

PULSE-BASED FLIP-FLOP HAVING SCAN INPUT SIGNAL

CROSS-REFERENCE TO RELATED APPLICATION

This application claims priority to and the benefit of Korean Patent Application No. 10-2008-0024895, filed on Mar. 18, 2008, in the Korean Intellectual Property Office, the entire content of which is incorporated herein by reference.

BACKGROUND

The present disclosure relates to a flip-flop, and more particularly, to a flip-flop which transmits a scan input and data for scan-testing a semiconductor circuit.

Device for testability (DFT) technologies used to test a semiconductor chip are widely used to maintain the quality of the semiconductor chip. Scan test technology, which is one of the DFT technologies, is an old technology, but still plays an important role in chip testing technology.

A flip-flop stores and sequentially transmits received signals in response to a clock signal or a pulse signal. A flip-flop having a scan input receives a test scan signal and outputs a test scan signal so as to test a logic circuit unit in a semiconductor circuit. Such a flip-flop having a scan input provides an easy test of the logic circuit unit.

FIG. 1 is a circuit diagram illustrating a conventional flip-flop 100 having a scan input.

Referring to FIG. 1, the conventional flip-flop 100 includes a multiplexer 110, which receives a data signal D and a scan input signal SI, and a master slave flip-flop 120. The multiplexer 110 includes a first AND gate 111, which receives and performs an AND operation on the data signal D and an inversed scan enable signal SEB, a second AND gate 112, which receives and performs an AND operation on the scan input signal SI and a scan enable signal SE, and a first NOR gate 113, which performs a NOR operation on outputs of the first AND gate 111 and the second AND gate 112.

The master slave flip-flop 120 includes a first tri-state inverter 121, which inverts and then outputs an output of the first NOR gate 113 when an inversed clock signal CKB is logic high, first latch units 122, 123, which latch an output of the first tri-state inverter 121 in response to a clock signal CK and the inversed clock signal CKB, a second tri-state inverter 124, which inverses and then outputs an output of the first latch units 122, 123 when the inversed clock signal CKB is logic high, second latch units 125, 126, which latch an output of the second tri-state inverter 124 in response to the clock signal SK and the inversed clock signal CKB, and an inverter 127, which inverses and then outputs an output of the second latch units 125, 126.

When the scan enable signal SE is logic low, the data signal D is output through the first AND gate 111 and the first NOR gate 113. When the clock signal CK is logic low, the data signal D is transmitted to the first latch units 122, 123. When the clock signal CK is logic high, the first tri-state inverter 121 is turned off and the data signal D is stored in the first latch units 122, 123. The second tri-state inverter 124 inverses the data signal D stored in the first latch units 122, 123, as the data signal D is synchronized with a next clock signal CK in logic low, and transmits the inversed data signal D to the second latch units 125, 126. The data signal D stored in the second latch units 125, 126 is transmitted to a logic circuit unit of a semiconductor chip via the inverter 127. The second latch units 125, 126 maintain stored data until the data is synchronized with a next clock signal.

However, since the conventional flip-flop 100 having such a structure must include the multiplexer 110 at an input terminal of the flip-flop 100, the setup time by the multiplexer 110 remarkably increases. Also, the master slave flip-flop 120 using a master slave method has a long input-to-output delay (i.e., the delay time from input to output), and thus the conventional flip-flop 100 is not suitable for high speed use.

SUMMARY

According to an exemplary embodiment of the present invention, a flip-flop is provided which includes a first pulse signal generator which generates a first pulse signal in response to a scan enable signal and an inversed scan input signal. A second pulse signal generator generates a second pulse signal in response to the scan enable signal and a scan input signal. A signal transmitter receives a data signal and transmits the data signal to a first node in response to either one of the first and second pulse signals. A signal latch unit receives the data signal transmitted to the first node, and latches and outputs the data signal in response to another one of the first and second pulse signals.

According to another exemplary embodiment of the present invention, a flip-flop is provided for outputting a scan input signal and a data signal to a semiconductor device. The flip-flop includes a pulse signal generator which independently generates a first pulse signal and a second pulse signal in response to a scan enable signal, the scan input signal, and an inversed scan input signal. A signal transmitter receives the data signal, the scan enable signal, and the first pulse signal, and drives a first node. A signal latch unit receives a signal of the first node, the scan enable signal, and the second pulse signal and drives a second node. When the scan enable signal is inactivated, the pulse signal generator generates the first and second pulse signals, the first node is driven in logic high or logic low in response to the data signal and the first pulse signal, and the second node is driven in logic high or logic low in response to the signal of the first node and the second pulse signal.

DETAILED DESCRIPTION OF THE EMBODIMENTS

Figure 1:
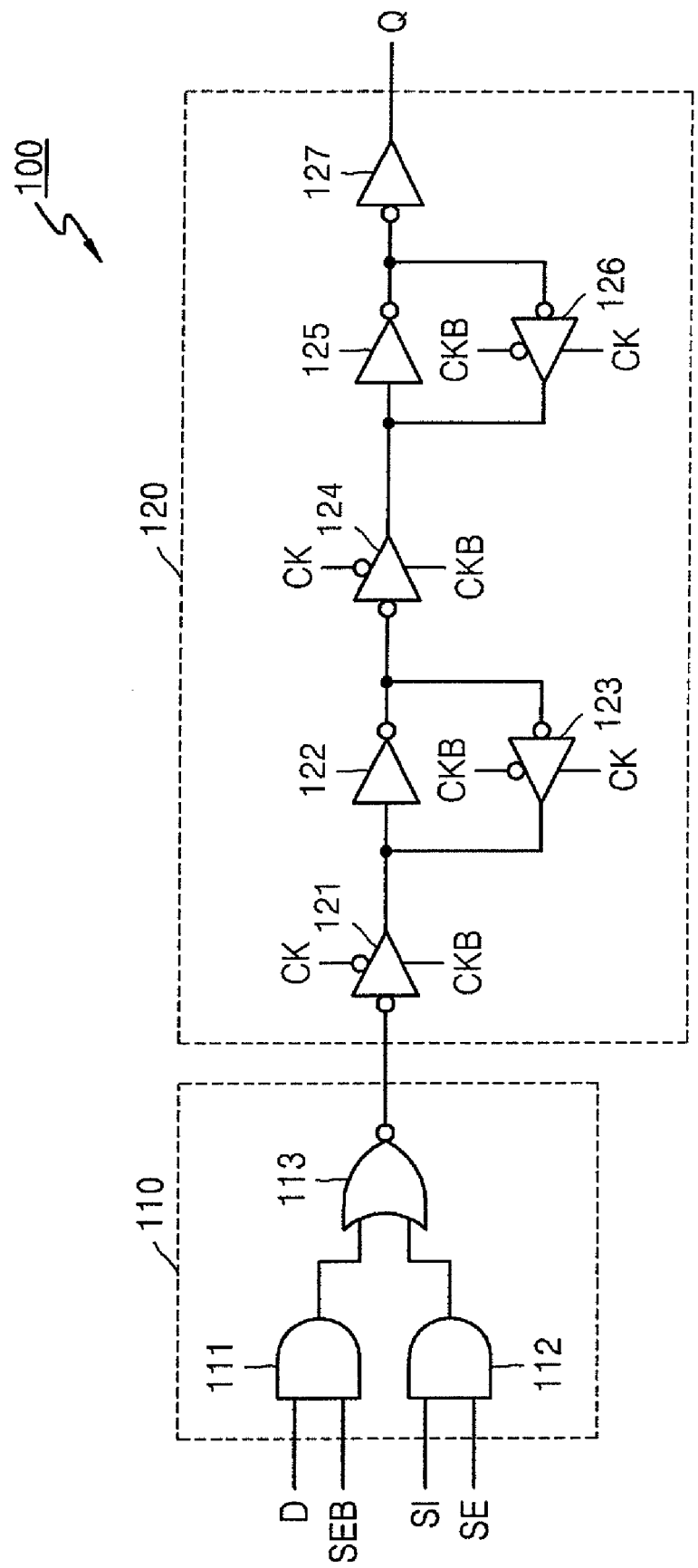
FIG. 1 is a circuit diagram illustrating a conventional flip-flop having a scan input.
Figure 2:
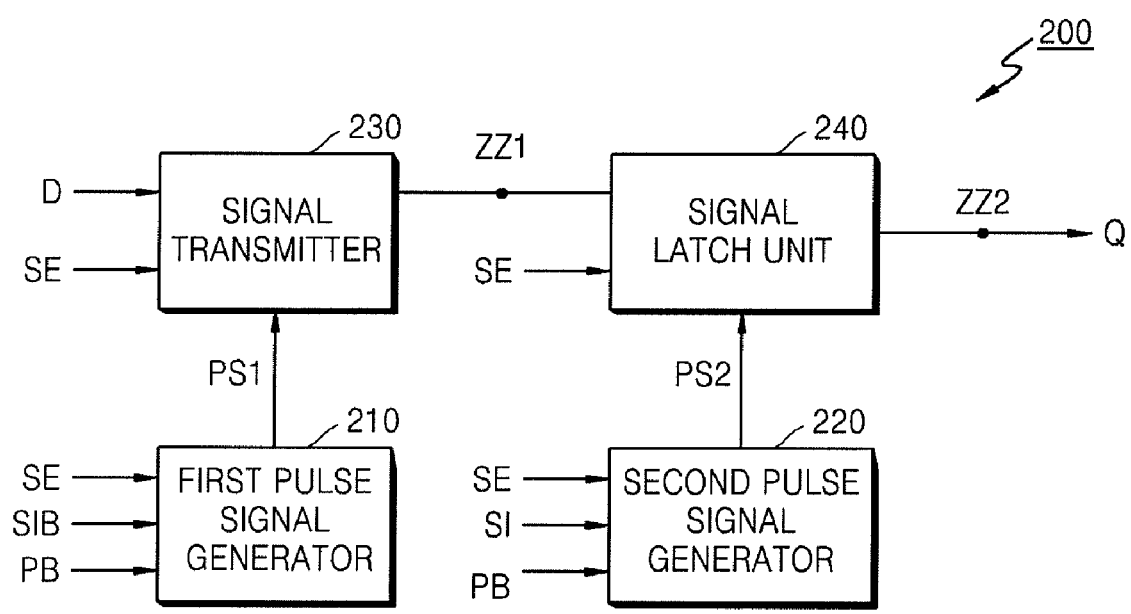
FIG. 2 is a block diagram illustrating a flip-flop according to an exemplary embodiment of the present invention.

Referring now to FIG. 2, the flip-flop 200 includes a first pulse signal generator 210, a second pulse signal generator 220, a signal transmitter 230, and a signal latch unit 240.

The first pulse signal generator 210 receives a reference pulse signal PB, and generates a first pulse signal PS1 in response to the received reference pulse signal PB, a scan enable signal SE, and an inversed scan input signal SIB. Also, the second pulse signal generator 220 receives the reference pulse signal PB, and generates a second pulse signal PS2 in response to the received reference pulse signal PB, the scan enable signal SE, and the scan input signal SI. The reference pulse signal PB may be generated by using a predetermined clock signal received via the flip-flop 200, and accordingly, the flip-flop 200 may include other circuit devices for generating the reference pulse signal PB by receiving the predetermined clock signal.

The first pulse signal PS1 and the second pulse signal PS2 may be the same or different. When the scan enable signal SE provided to the first and second pulse signal generators 210, 220 is inactivated, the generated first and second pulse signals PS1, PS2 may be the same. For example, the first and second pulse signals PS1, PS2 may have the same pulse width, and be respectively provided to the signal transmitter 230 and the signal latch unit 240. Here, the first and second pulse signals PS1, PS2 may be used to transmit a data signal D, which is provided to the signal transmitter 230, to a first node ZZ1 and a second node ZZ2.

When the scan enable signal SE is activated, the first and second pulse signals PS1, PS2 may be different. For example, when the scan enable signal SE is activated, only one of the first pulse signal PS1 and the second pulse signal PS2 has an activated pulse width. For example, when the scan enable signal SE is activated, only the first pulse signal PS1 has an activated pulse width if the scan input signal SI is logic high, and only the second pulse signal PS2 has an activated pulse width if the scan input signal SI is logic low.

The signal transmitter 230 receives the data signal D and the scan enable signal SE, and receives the first pulse signal PS1 from the first pulse signal generator 210. When the scan enable signal SE is inactivated, the signal transmitter 230 transmits the data signal D to the first node ZZ1 in response to the first pulse signal PS1. The first node ZZ1 may be pre-charged to a voltage corresponding to logic high, and the voltage of the first node ZZ1 may be discharged according to a logic state of the data signal D, thereby transmitting the data signal D to the first node ZZ1.

Also, the signal latch unit 240 receives a signal of the first node ZZ1 and the scan enable signal SE, and receives the second pulse signal PS2 from the second pulse signal generator 220. When the scan enable signal SE is inactivated, the signal latch unit 240 transmits the signal of the first node ZZ1 to the second node ZZ2 in response to the second pulse signal PS2. The signal transmitted to the second node ZZ2 is latched by a latch circuit (not shown) included in the signal latch unit 240, and externally transmitted as an output signal Q via a predetermined output buffer (not shown). The signal of the first node ZZ1 may be transmitted to the second node ZZ2 by discharging a voltage of the second node ZZ2 according to logic states of the signal of the first node ZZ1 and the second pulse signal PS2. When the scan enable signal SE is activated, the scan input signal SI is transmitted via the first and second nodes ZZ1, ZZ2.

The operation of the signal transmitter 230 and the signal latch unit 240 will now be described in more detail.

When the scan enable signal SE is activated, either one of the first pulse signal PS1 and the second pulse signal PS2 is activated and outputted, according to states of the scan input signal SI and the inversed scan input signal SIB. For example, when the scan enable signal SE is activated and the scan input signal SI is logic high, only the first pulse signal PS1 is activated and outputted. Alternatively, when the scan input signal SI is logic low, only the second pulse signal PS2 is activated and outputted. The first pulse signal PS1 may be used as a control signal for discharging a voltage of the first node ZZ1, and the second pulse signal PS2 may be used as a control signal for discharging a voltage of the second node ZZ2. When the scan enable signal SE is activated, the scan input signal SI is transmitted to the second node ZZ2 according to a method of discharging either one of the first and second nodes ZZ1, ZZ2.

When the scan enable signal SE is activated, the signal transmitter 230 may or may not discharge the first node ZZ1 according to a state of the first pulse signal PS1, regardless of a state of the data signal D. For example, when the scan input signal SI is logic high, the first pulse signal PS1 is activated and transmitted to the signal transmitter 230, and the signal transmitter 230 discharges the first node ZZ1 in response to the first pulse signal PS1. A signal of the discharged first node ZZ1 is transmitted to an input terminal of the signal latch unit 240.

The signal latch unit 240 charges the second node ZZ2 in response to a signal of the first node ZZ1 that is logic low, and thus a voltage level of the second node ZZ2 becomes logic high. Also, the signal latch unit 240 blocks a discharge path of the second node ZZ2 in response to the inactivated second pulse signal PS2. As described above, the signal latch unit 240 externally provides the output signal Q in logic high corresponding to the scan input signal SI.

The operation of the flip-flop 200 according to the current exemplary embodiment will now be described in more detail with reference to FIG. 3.

Figure 3:
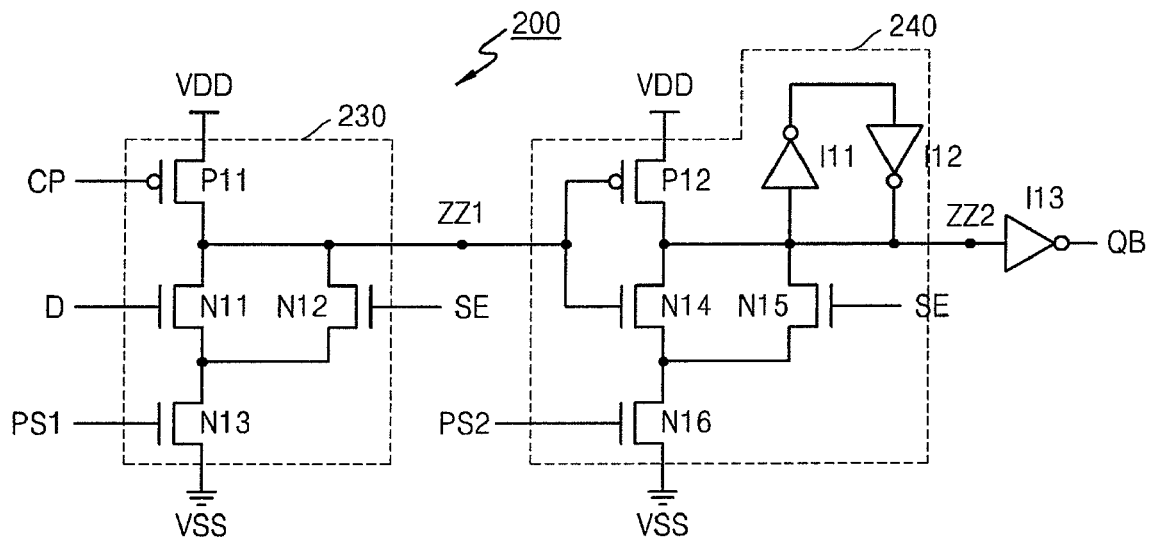
FIG. 3 is a circuit diagram illustrating the flip-flop of FIG. 2.
Figure 3:
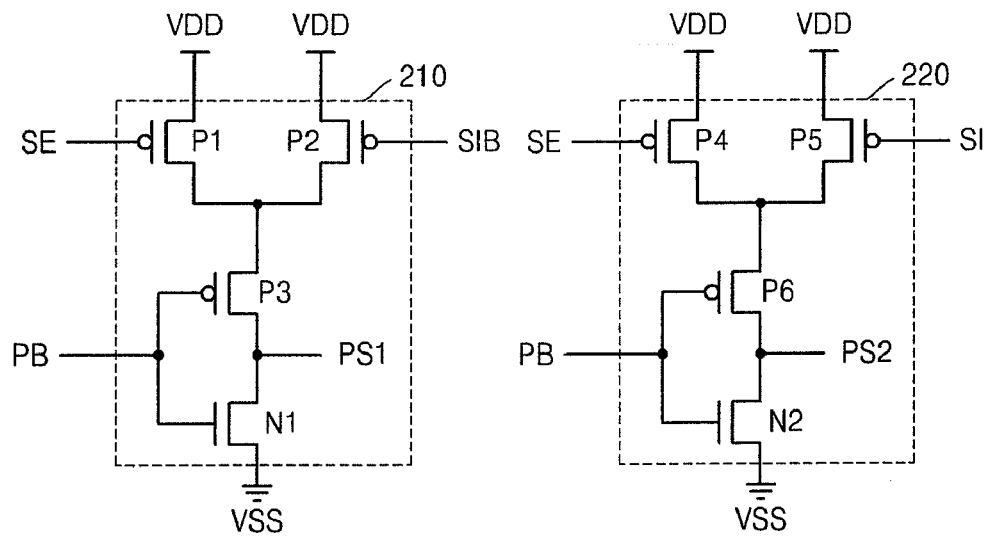

FIG. 3 is a circuit diagram illustrating an exemplary embodiment of the flip-flop 200 of FIG. 2. Each of the first pulse signal generator 210, the second pulse signal generator 220, the signal transmitter 230, and the signal latch unit 240 includes at least one PMOS transistor and at least one NMOS transistor.

For example, the first pulse generator 210 includes a PMOS transistor P1 which operates in response to the scan enable signal SE and having a first electrode connected to a power supply voltage VDD, and a PMOS transistor P2 which operates in response to the inversed scan input signal SIB and connected to the PMOS transistor P1 in parallel. Also, the first pulse generator 210 further includes a PMOS transistor P3 which operates in response to the reference pulse signal PB and having a first electrode connected to second electrodes of the PMOS transistors P1, P2, and an NMOS transistor N1 which operates in response to the reference pulse signal PB and connected between the PMOS transistor P3 and a ground voltage VSS. The first pulse signal PS1 is generated from a signal of a node to which a second electrode of the PMOS transistor P3 and a first electrode of the NMOS transistor N1 are connected.

Also, the second pulse signal generator 220 includes a PMOS transistor P4 which operates in response to the scan enable signal SE and having a first electrode connected to the power supply voltage VDD, and a PMOS transistor P5 which operates in response to the scan input signal SI and connected to the PMOS transistor P4 in parallel. The second pulse signal generator 220 further includes a PMOS transistor P6 which operates in response to the reference pulse signal PB and having a first electrode connected to second electrodes of the PMOS transistors P4, P5, and an NMOS transistor N2 which operates in response to the reference pulse signal PB and connected between the PMOS transistor P6 and the ground voltage VSS. The second pulse signal PS2 is generated from a signal of a node to which a second electrode of the PMOS transistor P6 and a first electrode of the NMOS transistor N2 are connected.

The signal transmitter 230 includes at least one PMOS transistor and at least one NMOS transistor for operating the first node ZZ1. For example, the signal transmitter 230 includes a PMOS transistor P11 which operates in response to a predetermined control signal CP, and having a first electrode connected to the power supply voltage VDD and a second electrode connected to the first node ZZ1, and an NMOS transistor N11 which operates in response to the data signal D and having a first electrode connected to the first node ZZ1. The signal transmitter 230 further includes an NMOS transistor N12 which operates in response to the scan enable signal SE and connected to the NMOS transistor N11 in parallel, and an NMOS transistor N13 which operates in response to the first pulse signal PS1 and having a first electrode connected to second electrodes of the NMOS transistors N11, N12 and a second electrode connected to the ground voltage VSS. The control signal CP input to a gate of the PMOS transistor P11 may be any one of a reference clock signal CLK, the first pulse signal PS1, the second pulse signal PS2, and an inversed signal P of the reference pulse signal PB. According to another exemplary embodiment the control signal CP may be the reference clock signal CLK or the first pulse signal PS1.

The signal latch unit 240 includes at least one PMOS transistor and at least one NMOS transistor for operating the second node ZZ2. For example, the signal latch unit 240 includes a PMOS transistor P12 which operates in response to a signal of the first node ZZ1, and having a first electrode connected to the power supply voltage VDD and a second electrode connected to the second node ZZ2, and an NMOS transistor N14 which operates in response to the signal of the first node ZZ1 and having a first electrode connected to the second node ZZ2. The signal latch unit 240 further includes an NMOS transistor N15 which operates in response to the scan enable signal SE and connected to the NMOS transistor N14 in parallel, and an NMOS transistor N16 which operates in response to the second pulse signal PS2 and having a first electrode connected to second electrodes of the NMOS transistors N14, N15 and a second electrode connected to the ground voltage VSS. The signal latch unit 240 further includes at least one inverter I11, I12 forming one latch so as to latch and output a signal transmitted to the second node ZZ2, and an output buffer I13 for externally providing a signal of the latched second node ZZ2. An inverter may be used as the output buffer I13, and accordingly, an output signal of the signal latch unit 240 is an inversed signal QB of the output signal Q of FIG. 2.

Figure 4:
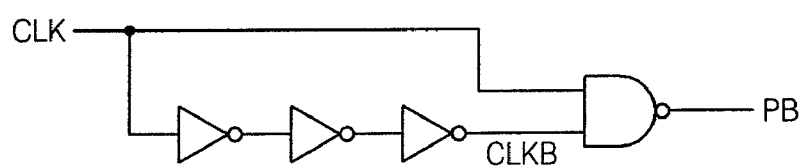
FIG. 4 is a circuit diagram illustrating an exemplary embodiment of the present invention for generating a reference pulse signal by receiving a reference clock signal.

FIG. 4 is a circuit diagram illustrating an example of a circuit for generating the reference pulse signal PB by receiving the reference clock signal CLK. The flip-flop 200 receives the reference clock signal CLK, and generates the reference pulse signal PB used in the first and second pulse signal generators 210, 220 by using the reference clock signal CLK. As illustrated in FIG. 4, a circuit for generating the reference pulse signal PB by using the reference clock signal CLK includes at least one inverter and one NAND gate, and may be included in the flip flop 200.

The operation of the flip-flop 200 will now be described in more detail.

First, when the scan enable signal SE is inactivated (logic low), the PMOS transistors P1, P4 respectively of the first and second pulse signal generators 210, 220 are each turned on. Accordingly, the power supply voltage VDD is provided to the first electrode of the PMOS transistor P3 regardless of the inversed scan input signal SIB, and the first pulse signal generator 210 generates an inversed signal of the reference pulse signal PB as the first pulse signal PS1. Also, the power supply voltage VDD is provided to the first electrode of the PMOS transistor P6 regardless of the scan input signal SI, and the second pulse signal generator 220 generates an inversed signal of the reference pulse signal PB as the second pulse signal PS2.

Since the scan enable signal SE is inactivated, the NMOS transistor N12 of the signal transmitter 230 is turned off, and the NMOS transistor N15 of the signal latch unit 240 is turned off. As such, according to the operation of the signal transmitter 230 and the signal latch unit 240, the flip-flop 200 operates as a general flip-flop that stores and outputs the data signal D in a latch, in response to a triggered edge of the first pulse signal PS1, the second pulse signal PS2, and the control signal CP.

In more detail, the first node ZZ1 is pre-charged as the PMOS transistor P11 is turned on by the control signal CP, in a period apart from an activation period of the first pulse signal PS1. As described above, the control signal CP may be any one of the reference clock signal CLK, the first pulse signal PS1, the second pulse signal PS2, and the inversed signal P of the reference pulse signal PB.

When the data signal D is logic high, the first node ZZ1 is discharged in the activation period of the first pulse signal PS1. Also, when a signal of the first node ZZ1 becomes logic low according to such a discharging operation, the PMOS transistor P12 is turned on and the NMOS transistor N14 is turned off, and thus a signal of the second node ZZ2 has a value corresponding to logic high. The signal of the second node ZZ2 corresponding to logic high is latched by the inverters I11, I12, and externally outputted via the output buffer I13. When the output buffer I13 is formed as an inverter, a signal QB provided via the output buffer I13 becomes an inversed signal (logic low) of the data signal D.

When the data signal D is logic low, a discharge path of the first node ZZ1 is blocked, and thus the signal of the first node ZZ1 has a value corresponding to logic high. When the signal of the first node ZZ1 is logic high, the PMOS transistor P12 is turned off, the NMOS transistor N14 is turned on, and a discharge path of the second node ZZ2 is formed in an activation period of the second pulse signal PS2. Accordingly, the signal of the second node ZZ2 has a value corresponding to logic low, and a signal QB provided via the output buffer I13 has a value of logic high.

As described above, when the scan enable signal SE is inactivated, the flip-flop 200 operates like a general flip-flop that receives or outputs a data signal based on a pulse signal. Alternatively, when the scan enable signal SE is activated, i.e., when a scan mode is activated, the flip-flop 200 needs to output a signal corresponding to the scan input signal SI. Details thereof will now be described with reference to FIGS. 5A and 5B.

Figure 5A:
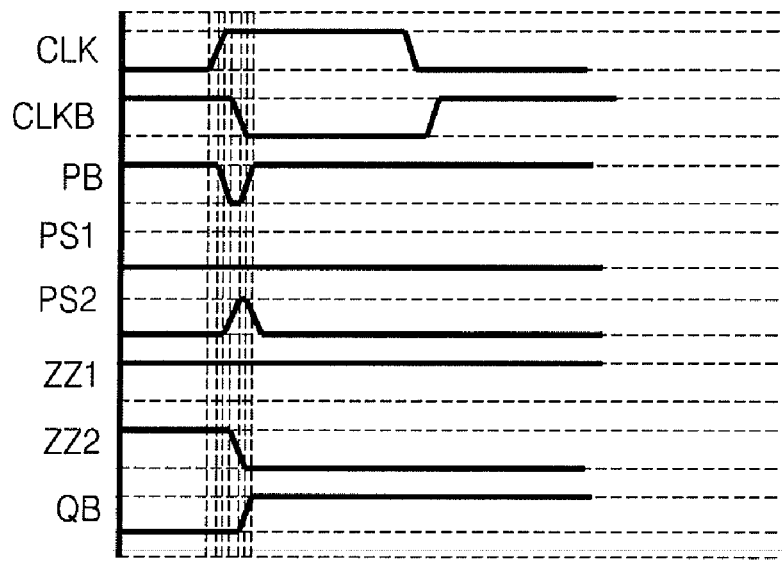
FIGS. 5A and 5B are waveform diagrams illustrating the operation of a flip-flop when a scan enable signal is activated.
Figure 5B:
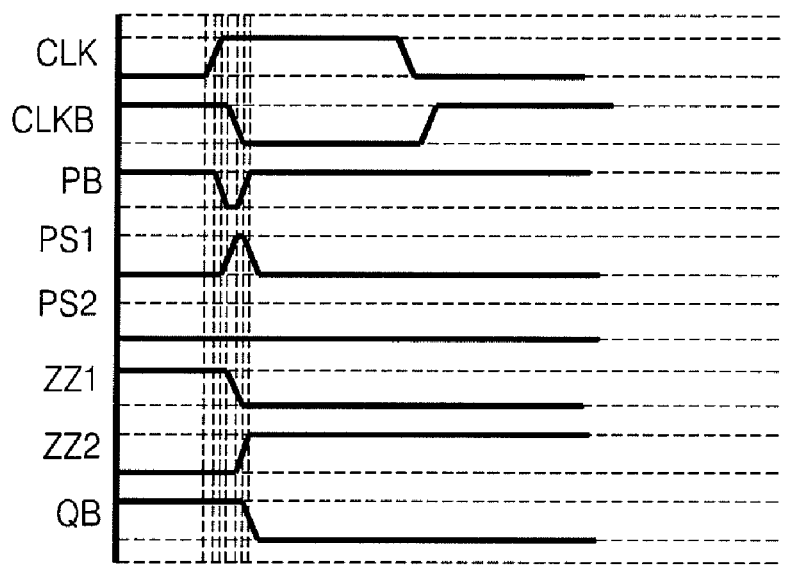

FIGS. 5A and 5B are waveform diagrams illustrating the operation of the flip-flop 200 when the scan enable signal SE is activated.

FIG. 5A illustrates the operation of the flip-flop 200 when the scan enable signal SE is logic high and the scan input signal SI is logic low. An output signal QB of the flip-flop 200 before activation of a pulse signal corresponds to a logic low value.

First, the reference pulse signal PB is generated by using the reference clock signal CLK, and when the scan input signal SI is logic low, only the second pulse signal PS2 from among the first and second pulse signals PS1, PS2 is activated and outputted. Also, the NMOS transistor N12 for a discharge path of the first node ZZ1 and the NMOS transistor N15 for a discharge path of the second node ZZ2 are always turned on.

When the scan input signal SI is logic low, the first pulse signal PS1 is not activated, and thus the discharge path of the first node ZZ1 is blocked. Accordingly, a signal of the first node ZZ1 maintains a logic high value. Also, when the signal of the first node ZZ1 is logic high, the discharge path of the second node ZZ2 is formed in an activation period of the second pulse signal PS2. In other words, a level of a signal of the second node ZZ2 is discharged to logic low in response to a level transition of the second pulse signal PS2. As illustrated in FIG. 5A, a signal of the second node ZZ2 corresponding to logic low is latched, and the output signal QB has a value corresponding to logic high.

FIG. 5B illustrates the operation of the flip-flop 200 when the scan enable signal SE is logic high and the scan input signal SI is logic high. An output signal QB of the flip-flop 200 before activation of a pulse signal corresponds to a logic high value.

When the scan input signal SI is logic high, a discharge path of the first node ZZ1 is formed in an activation period of the first pulse signal PS1. Accordingly, a signal of the first node ZZ1 is discharged to logic low in response to a level transition of the first pulse signal PS1. Also, a discharge path of the second node ZZ2 is blocked since the second pulse signal PS2 is inactivated. The PMOS transistor P12 is turned on when the signal of the first node ZZ2 is logic low, and thus a signal of the second node ZZ2 maintains or is increased to a logic high value. As illustrated in FIG. 5B, the signal of the second node ZZ2 corresponding to logic high is latched, and the output signal QB has a value corresponding to logic low.

According to the structure of the flip-flop 200 of the current exemplary embodiment, a load that may be generated in a multiplexer including an input terminal of a data signal and an input terminal of a scan input signal may be minimized. Also, the flip-flop 200 has a scan input signal, and thus is realized as a pulse-based flip-flop, instead of a master slave based flip-flop. As such, the setup time and the input-to-output delay can be reduced.

Those skilled in the art can appreciate that the detailed circuit configuration of the flip-flop 200 according to the current exemplary embodiment may be varied. For example, in order to stably maintain the level of the signal of the first node ZZ1, a circuit for storing or maintaining the signal may be connected to the first node ZZ1. A circuit for storing the signal of the first node ZZ1 and/or the second node ZZ2 may be realized by using a plurality of inverters. Also, in order to prevent leakage of a signal via a discharge path, the circuit may include a tri-state buffer or a transmission gate, or a pass transistor. Alternatively, a keeper including one PMOS transistor and one NMOS transistor may be used. Further, the storing of a signal may be dependent upon a parasitic capacitance in the first node ZZ1 and/or the second node ZZ2, without using a separate circuit.

Figure 6A:
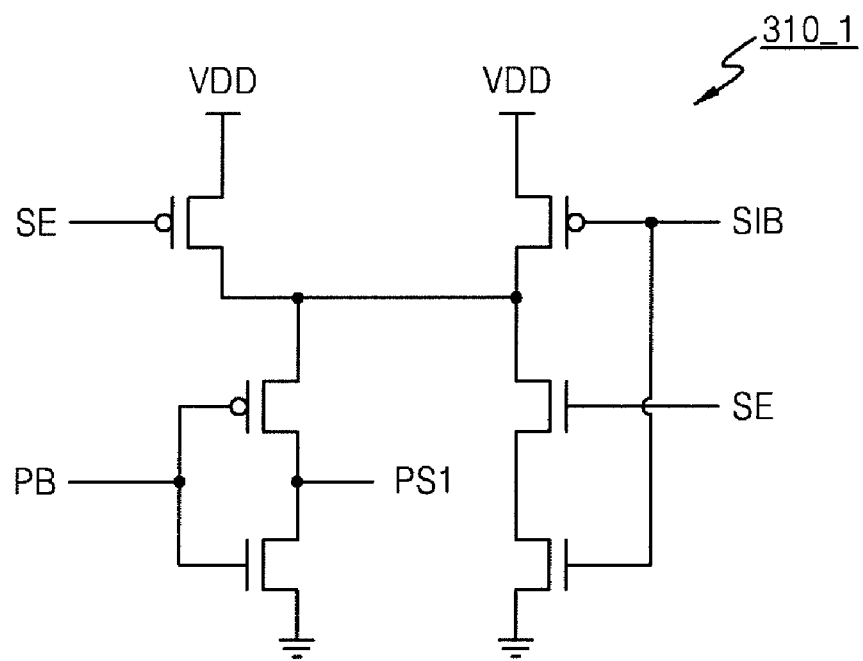
FIGS. 6A, 6B, and 6C are circuit diagrams respectively illustrating first pulse signal generators according to exemplary embodiments of the present invention.
Figure 6B:
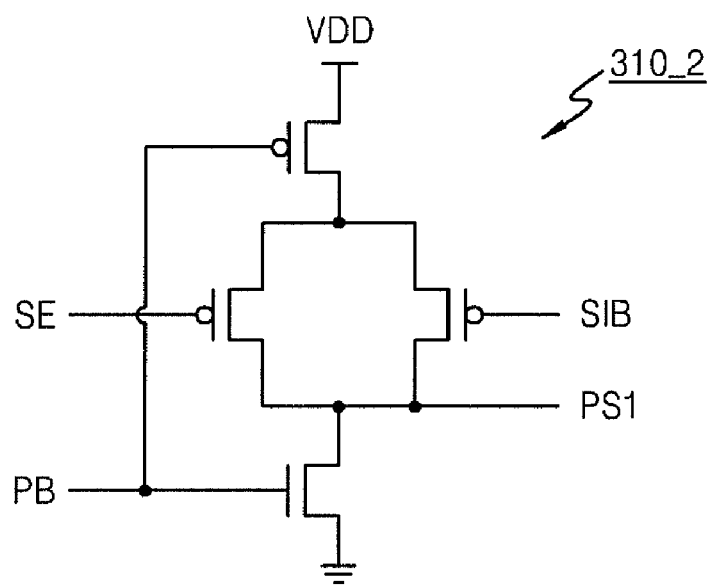
Figure 6C:
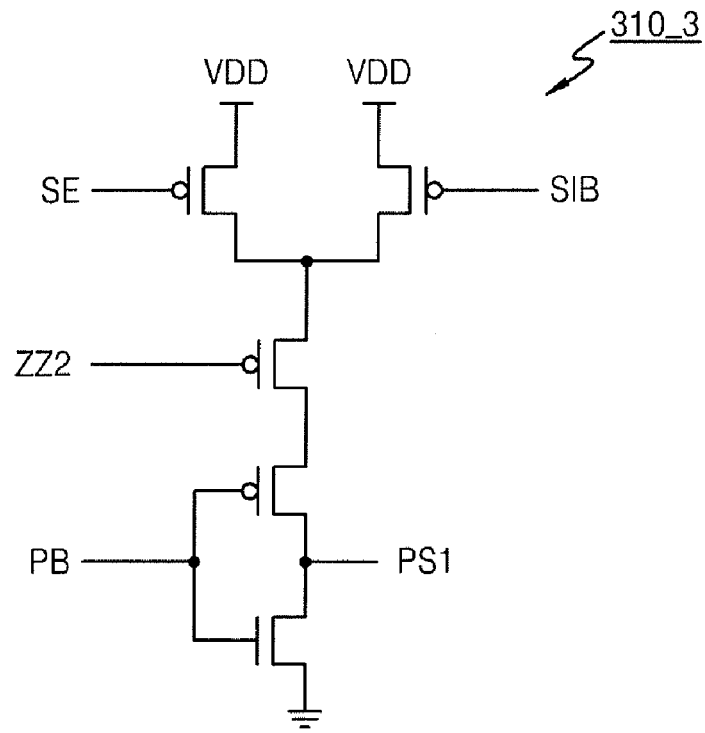

FIGS. 6A, 6B, and 6C illustrate several exemplary embodiments of the first pulse signal generator 210 of FIG. 3, which may take many different forms within the scope of the present invention. The first pulse signal generators 310_1, 310_2 lessen charge sharing. As illustrated in FIG. 6A, the first pulse signal generator 310_1 further includes an NMOS transistor which operates in response to the scan enable signal SE, and another NMOS transistor connected between the NMOS transistor and a ground voltage VSS and which operates in response to the inversed scan input signal SIB, aside from the circuit configuration of the first pulse signal generator 210 of FIG. 3.

As illustrated in FIG. 6B, the first pulse signal generator 310_2 includes a PMOS transistor and an NMOS transistor which operates by receiving the reference pulse signal PB. The first pulse signal generator 310_2 also includes a PMOS transistor which operates by receiving the scan enable signal SE, and another PMOS transistor which operates in response to the inversed scan input signal SIB and connected to the PMOS transistor in parallel. The PMOS transistors connected in parallel are connected between the PMOS transistor and the NMOS transistor which operates by receiving the reference pulse signal PB.

FIG. 6C illustrates the first pulse signal generator 310_3 for low power. When the first pulse signal PS1 is activated, a discharge path of the first node ZZ1 is formed, and a signal in logic high is transmitted to the second node ZZ2. Here, when a current state of the second node ZZ2 is logic high, the first pulse signal PS1 does not need to be activated, and thus the first pulse signal PS1 is activated only when the second node ZZ2 is logic low.

Accordingly, the first pulse signal generator 310_3 further includes a PMOS transistor which operates by receiving a feedback from the second node ZZ2, aside from the circuit configuration of the first pulse signal generator 210 of FIG. 3. The PMOS transistor may be connected between the second electrodes of the PMOS transistors P1, P2 respectively receiving the scan enable signal SE and the inversed scan input signal SIB, and the PMOS transistor P3 receiving the reference pulse signal PB. When the second node ZZ2 is logic high, the first pulse signal PS1 is blocked from being activated.

Figure 7A:
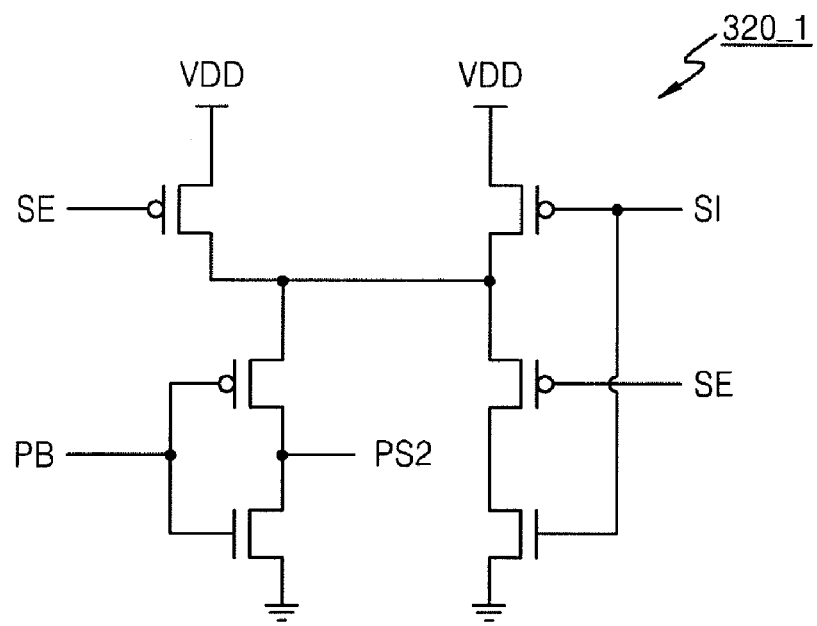
FIGS. 7A and 7B are circuit diagrams respectively illustrating second pulse signal generators according to exemplary embodiments of the present invention.
Figure 7B:
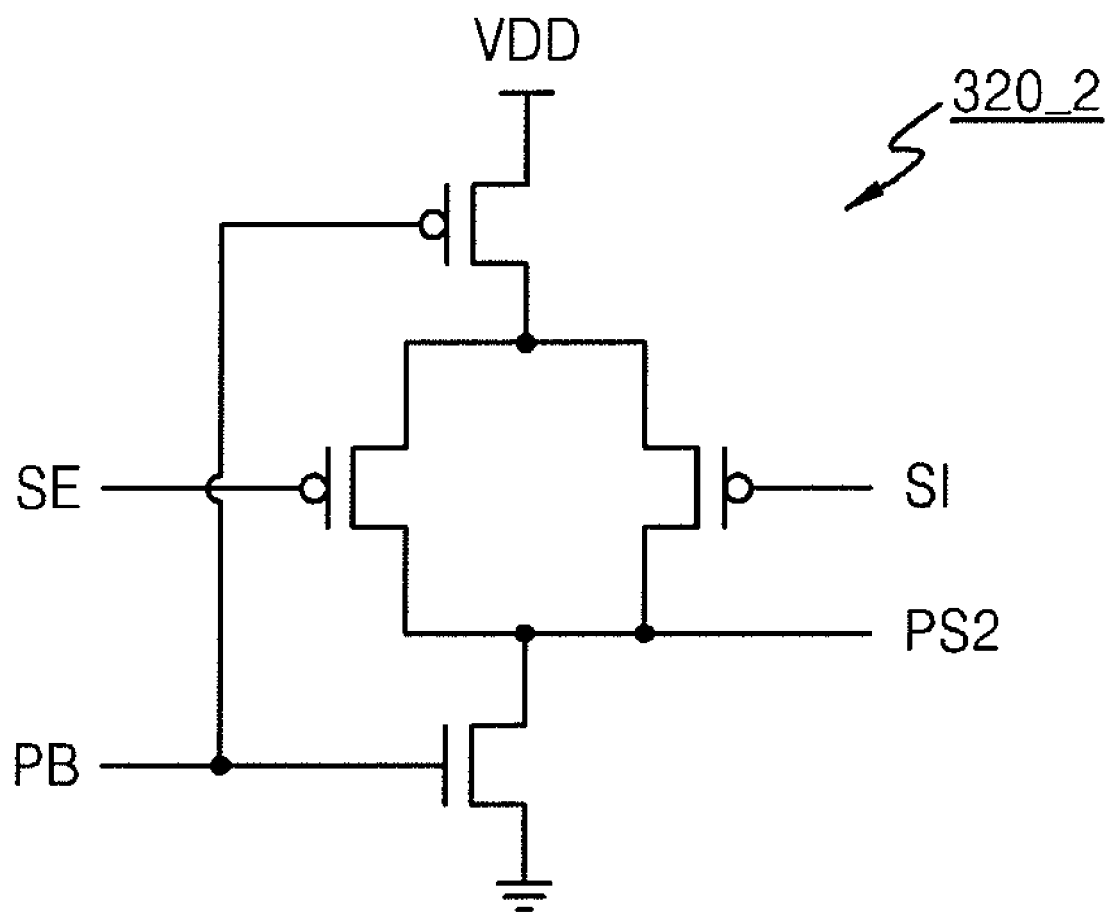

FIGS. 7A and 7B are circuit diagrams respectively illustrating embodiments of the second pulse signal generator 220 of FIG. 3, which may take many different forms within the scope of the present invention. For example, the second pulse signal generators 320_1, 320_2 lessen charge sharing. As illustrated in FIG. 7A, the second pulse signal generator 320_1 includes an NMOS transistor which operates by receiving the scan enable signal SE, and another NMOS transistor connected between the NMOS transistor and a ground voltage VSS and which operates in response to the scan input signal SI, aside from the circuit configuration of the second pulse signal generator 220 of FIG. 3.

Alternatively as illustrated in FIG. 7B, the second pulse signal generator 320_2 includes a PMOS transistor and an NMOS transistor which operate by receiving the reference pulse signal PB, and also a PMOS transistor which operates by receiving the scan enable signal SE and another PMOS transistor which operates in response to the scan input signal and connected to the PMOS transistor in parallel. The PMOS transistors connected in parallel are connected between the PMOS transistor and the NMOS transistor which operates by receiving the reference pulse signal PB.

Figure 8:
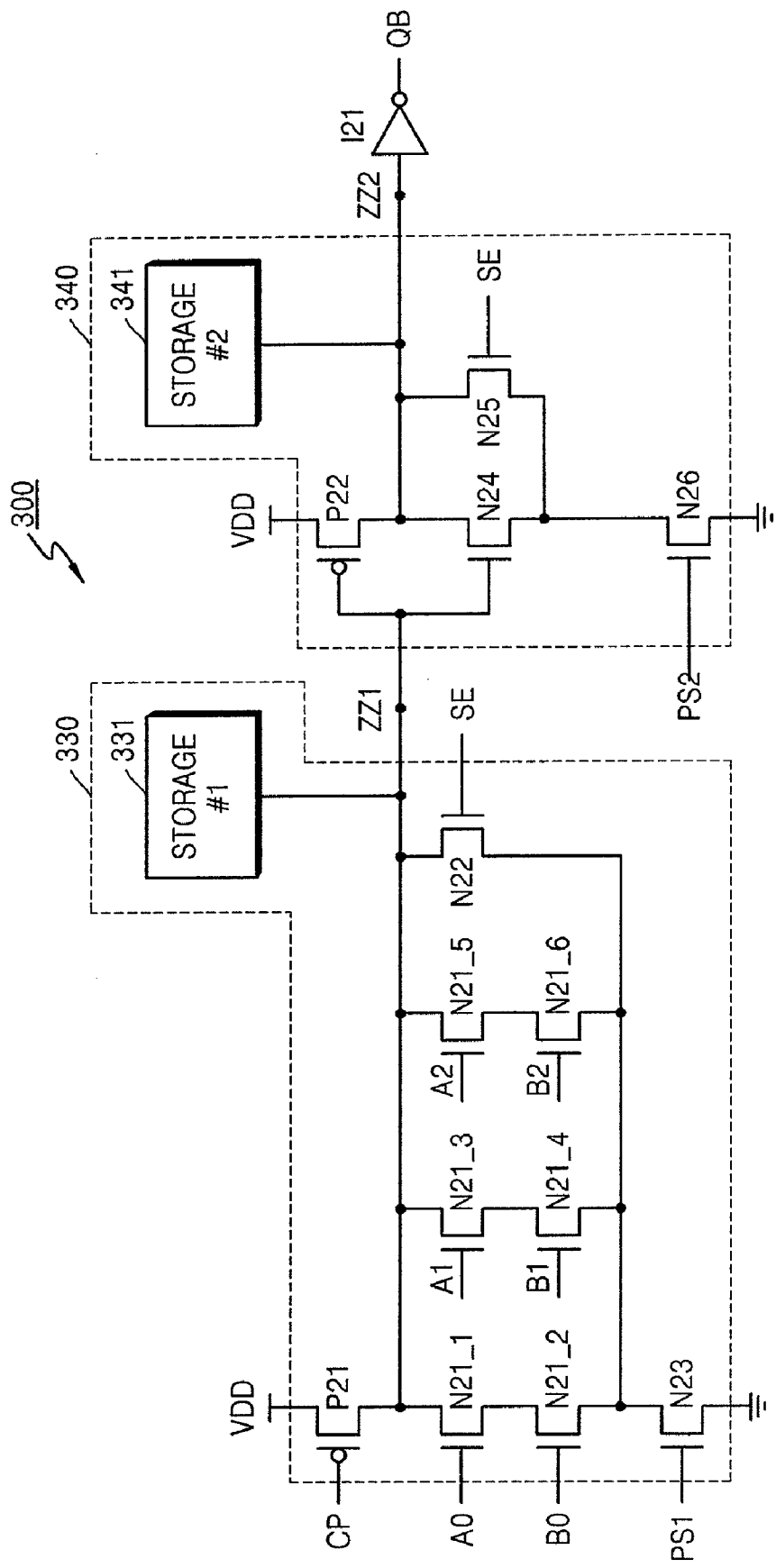
FIG. 8 is a circuit diagram illustrating a flip-flop according to an exemplary embodiment of the present invention.

FIG. 8 is a circuit diagram illustrating a flip-flop 300 according to another exemplary embodiment of the present invention. The flip-flop 300 includes a signal transmitter 330 and a signal latch unit 340. The flip-flop 300 may further include a first pulse signal generator (not shown) for generating the first pulse signal PS1 and a second pulse signal generator (not shown) for generating the second pulse signal PS2. The first and second pulse signal generators may be formed similar to the first and second pulse signal generators 210, 220 of FIG. 3, and thus further detailed descriptions thereof are omitted.

As illustrated in FIG. 8, the signal transmitter 330 includes at least one PMOS transistor and at least one NMOS transistor for driving the first node ZZ1. For example, the signal transmitter 330 includes a PMOS transistor P21 which operates in response to the control signal CP and having a first electrode connected to the power supply voltage VDD, and a second electrode connected to the first node ZZ1, an NMOS transistor N22 which operates in response to the scan enable signal SE and for forming a discharge path of the first node ZZ1, and an NMOS transistor N23 which operates in response to the first pulse signal PS1 and having a first electrode connected to a second electrode of the NMOS transistor N22, and a second electrode connected to the ground voltage VSS.

Unlike FIG. 3, where one data signal D is inputted, the signal transmitter 330 includes a logic operation circuit for performing logic operations by receiving data signals A0, A1, A2, B0, B1, B2. The logic operation circuit is connected to the NMOS transistor N22 in parallel. For example, the signal transmitter 330 further includes a logic operation portion which includes one or more transistors N21_1, N21_2, N21_3, N21_4, N21_5, N21_6 for receiving the plurality of data signals A0, A1, A2 and B0, B1, B2. When the scan enable signal SE is inactivated (logic low), a discharge path of the first node ZZ1 is formed or blocked according to the states of the data signals A0, A1, A2, B0, B1, B2. When a discharge path of the logic operation circuit N21_1, N21_2, N21_3, N21_4, N21_5, N21_6 is formed, the first node ZZ1 is discharged in an activation period of the first pulse signal PS1.

Also, the signal transmitter 330 may further include a storage unit 331 for stably maintaining a signal of the first node ZZ1.

Like the circuit configuration of FIG. 3, the signal latch unit 340 includes a PMOS transistor P22 and an NMOS transistor N24 which operate in response to a signal of the first node ZZ1. Also, the signal latch unit 340 includes an NMOS transistor N25 which operates in response to the scan enable signal SE and is connected to the NMOS transistor N24 in parallel, and an NMOS transistor N26 which operates in response to the second pulse signal PS2 and is connected to the ground voltage VSS. The signal latch unit 340 further includes a storage unit 341 for latching a signal of the second node ZZ2, and an output buffer I21 for outputting a signal of the latched second node ZZ2.

Figure 9:
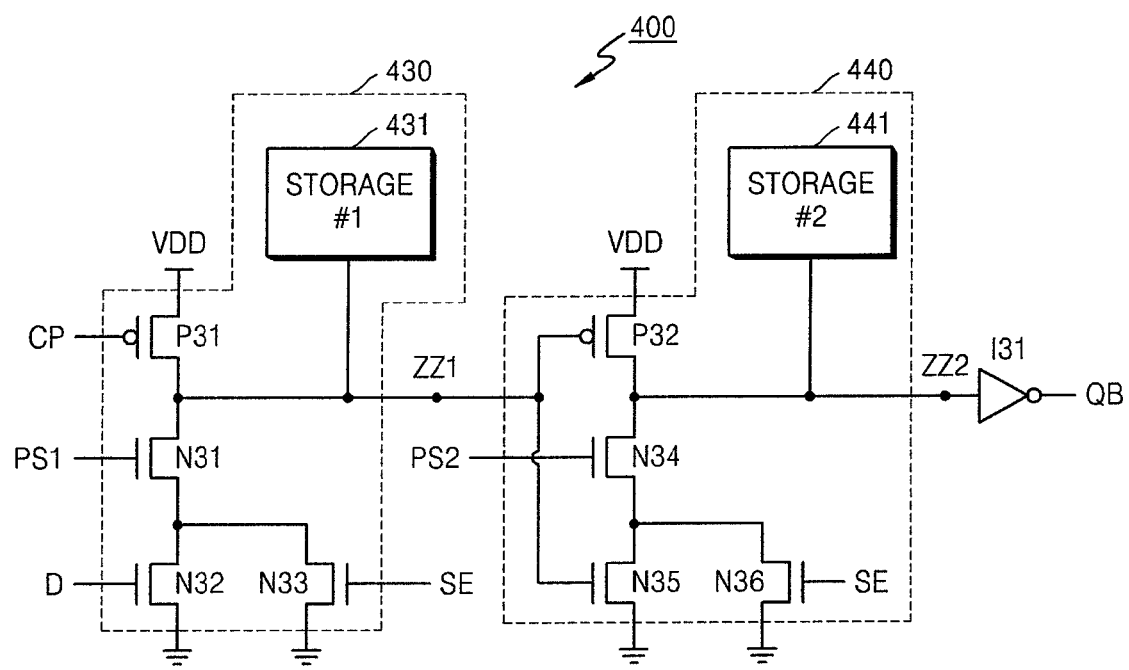
FIG. 9 is a circuit diagram illustrating a flip-flop according to an exemplary embodiment of the present invention.

FIG. 9 is a circuit diagram illustrating a flip-flop 400 according to an exemplary embodiment of the present invention. The flip-flop 400 includes a signal transmitter 430 and a signal latch unit 440. First and second pulse signal generators (not shown) that may be further included in the flip-flop 400 of FIG. 9 may be respectively formed similar to the first and second pulse signal generators 210, 220 of FIG. 3, and thus further detailed descriptions thereof are omitted.

The flip-flop 400 of FIG. 9 includes a circuit configuration for reducing parasitic capacitance components in the first and second nodes ZZ1, ZZ2. In more detail, in order to reduce the parasitic capacitance component of the first node ZZ1, the signal transmitter 430 includes a changed configuration of NMOS transistors included in the discharge path of the signal transmitter 230 of FIG. 3. Also, in order to reduce the parasitic capacitance component of the second node ZZ2, the signal latch unit 440 includes a changed configuration of NMOS transistors included in the discharge path of the signal latch unit 240 of FIG. 3.

As illustrated in FIG. 9, the signal transmitter 430 includes an NMOS transistor N31 which operates in response to the first pulse signal PS1 and having a first electrode connected to the first node ZZ1. Also, NMOS transistors N32, N33 that are connected in parallel are connected between a second electrode of the NMOS transistor N31 and a ground voltage VSS. Accordingly, the parasitic capacitance component of the first node ZZ1 is reduced as compared to the case when the NMOS transistors N32, N33 are connected to the first node ZZ1 in parallel. Also as described above, the signal transmitter 430 may further include a storage unit 431 for stably maintaining a signal of the first node ZZ1.

Similarly, in the signal latch unit 440 of FIG. 9, an NMOS transistor N34 which operates in response to the second pulse signal PS2 has a first electrode connected to the second node ZZ2. Also, NMOS transistors N35, N36 connected in parallel are connected between a second electrode of the NMOS transistor N34 and a ground voltage VSS. Accordingly, the parasitic capacitance component of the second node ZZ2 is reduced as compared to the case when the NMOS transistors N35, N36 are connected to the second node ZZ2 in parallel. Also as described above, the signal latch unit 440 may further include a storage unit 441 for stably maintaining a signal of the second node ZZ2.

While exemplary embodiments of the present invention have been particularly shown and described, it will be understood that various changes in form and details may be made therein without departing from the spirit and scope of the following claims.

What is claimed is:

1. A flip-flop comprising:
    a first pulse signal generator which generates a first pulse signal in response to a scan enable signal and an inversed scan input signal;
    a second pulse signal generator which generates a second pulse signal in response to the scan enable signal and a scan input signal;
    a signal transmitter which receives a data signal and transmits the data signal to a first node in response to either one of the first pulse signal and the second pulse signal; and
    a signal latch unit which receives the data signal transmitted to the first node, and latches and outputs the data signal in response to another one of the first pulse signal and the second pulse signal.

2. The flip-flop of claim 1, wherein, when the scan enable signal is inactivated, the first pulse signal generator generates the first pulse signal regardless of a level of the inversed scan input signal, and the second pulse signal generator generates the second pulse signal that is substantially similar to the first pulse signal regardless of a level of the scan input signal.

3. The flip-flop of claim 2, wherein the signal transmitter transmits the data signal to the first node in response to the first pulse signal, and
    the signal latch unit receives the data signal transmitted to the first node, transmits the received data signal to a second node in response to the second pulse signal, and latches and outputs the data signal transmitted to the second node.

4. The flip-flop of claim 3, wherein the first node is precharged to a first voltage during an inactivation period of the first pulse signal, and is discharged to a second voltage in response to the data signal in logic high or maintains the first voltage in response to the data signal in logic low, during a pulse period of the first pulse signal, and
    the second node is charged to the first voltage in response to the second voltage of the first node or discharged to the second voltage in response to the first voltage of the first node, during the pulse period of the first pulse signal.

5. The flip-flop of claim 1, wherein, when the scan enable signal is activated, either one of the first pulse signal generator and the second pulse signal generator generates a pulse signal in response to the inversed scan input signal and the scan input signal.

6. The flip-flop of claim 5, wherein, when the scan input signal is logic high, the first pulse signal generator generates and transmits the first pulse signal to the signal transmitter, and when the scan input signal is logic low, the second pulse signal generator generates and transmits the second pulse signal to the signal latch unit.

7. The flip-flop of claim 6, wherein when the scan input signal is logic high, the signal transmitter discharges the first node, which is pre-charged to the first voltage, to the second voltage in response to the first pulse signal, and the signal latch unit charges the second node to the first voltage in response to a voltage of the discharged first node, and latches and outputs a signal of the second node.

8. The flip-flop of claim 6, wherein when the scan input signal is logic low, the signal transmitter maintains the first node in the first voltage by blocking a discharge path, and the signal latch unit discharges the second node to the second voltage in response to the first voltage of the first node and the second pulse signal, and latches and outputs a signal of the second node.

9. The flip-flop of claim 1, wherein the signal transmitter comprises:

a first PMOS transistor which comprises a first electrode connected to a power supply voltage and a second electrode connected to the first node, and charges the first node to the power supply voltage;

a first NMOS transistor which operates in response to the data signal and comprises a first electrode connected to the first node;

a second NMOS transistor which operates in response to the scan enable signal and comprises a first electrode connected to the first node and a second electrode connected to a second electrode of the first NMOS transistor; and a third NMOS transistor which comprises a first electrode connected to the second electrodes of the first and second NMOS transistors and a second electrode connected to a ground voltage, and discharges the first node to the ground voltage.

10. The flip-flop of claim 9, wherein the signal latch unit comprises:

a second PMOS transistor which operates in response to a signal of the first node, and comprises a first electrode connected to the power supply voltage and a second electrode connected to the second node;

a fourth NMOS transistor which operates in response to the signal of the first node, and comprises a first electrode connected to the second node;

a fifth NMOS transistor which operates in response to the scan enable signal, and comprises a first electrode connected to the second node and a second electrode connected to a second electrode of the fourth NMOS transistor; and a sixth NMOS transistor which comprises a first electrode connected to the second electrodes of the fourth NMOS transistor and the fifth NMOS transistor, and a second electrode connected to the ground voltage.

11. The flip-flop of claim 10, wherein the signal latch unit further comprises a latch unit which is connected to the second node and latches a signal of the second node.

12. The flip-flop of claim 10, wherein the third NMOS transistor comprises a gate receiving the first pulse signal, and the sixth NMOS transistor comprises a gate receiving the second pulse gate.

13. The flip-flop of claim 1, wherein the first pulse signal generator comprises:

a first PMOS transistor which operates in response to the scan enable signal and comprises a first electrode connected to a power supply voltage;

a second PMOS transistor which operates in response to the inversed scan input signal and comprises a first electrode connected to the power supply voltage and a second electrode connected to a second electrode of the first PMOS transistor;

a third PMOS transistor which operates in response to a reference pulse signal, and comprises a first electrode connected to the second electrodes of the first and second PMOS transistors, and a second electrode connected to a first output terminal for outputting the first pulse signal; and a first NMOS transistor which operates in response to the reference pulse signal, and comprises a first electrode connected to the first output terminal and a second electrode connected to a ground voltage.

14. The flip-flop of claim 13, wherein the second pulse signal generator comprises:

a fourth PMOS transistor which operates in response to the scan enable signal, and comprises a first electrode connected to the power supply voltage;

a fifth PMOS transistor which operates in response to the scan input signal, and comprises a first electrode connected to the power supply voltage, and a second electrode connected to a second electrode of the fourth PMOS transistor;

a sixth PMOS transistor which operates in response to the reference pulse signal, and comprises a first electrode connected to the second electrodes of the fourth PMOS transistor and the fifth PMOS transistor, and a second electrode connected to a second output terminal for outputting the second pulse signal; and a second NMOS transistor which operates in response to the reference pulse signal, and comprises a first electrode connected to the second output terminal and a second electrode connected to the ground voltage.

15. A flip-flop for outputting a scan input signal and a data signal to a semiconductor device, wherein the flip-flop comprises:

a pulse signal generator which independently generates a first pulse signal and a second pulse signal in response to a scan enable signal, the scan input signal, and an inversed scan input signal;

a signal transmitter which receives the data signal, the scan enable signal, and the first pulse signal, and drives a first node; and a signal latch unit which receives a signal of the first node, the scan enable signal, and the second pulse signal and drives a second node, wherein when the scan enable signal is inactivated, the pulse signal generator generates the first and second pulse signals, the first node is driven in logic high or logic low in response to the data signal and the first pulse signal, and the second node is driven in logic high or logic low in response to the signal of the first node and the second pulse signal.

16. The flip-flop of claim 15, wherein when the scan enable signal is activated, the pulse signal generator generates either one of the first pulse signal and the second pulse signal in response to levels of the scan input signal and the inversed scan input signal, and transmits the scan input signal to the second node by discharging either one of the first node and the second node in response to the either one of the first pulse signal and the second pulse signal.

17. The flip-flop of claim 15, wherein the signal transmitter comprises:
a first NMOS transistor which operates in response to the data signal;
a second NMOS transistor which operates in response to the scan enable signal, and is connected to the first NMOS transistor in parallel; and
a third NMOS transistor which forms a discharge path of the first node together with at least one of the first and second NMOS transistors, in response to the first pulse signal.

18. The flip-flop of claim 15, wherein the signal latch unit comprises:
a first NMOS transistor which operates in response to a signal of the first node;
a second NMOS transistor which operates in response to the scan enable signal, and is connected to the first NMOS transistor in parallel; and
a third NMOS transistor which operates in response to the second pulse signal, and forms a discharge path of the second node together with at least one of the first NMOS transistor and the second NMOS transistor, in response to the second pulse signal.

19. The flip-flop of claim 15, wherein the signal transmitter comprises:
a logic operation circuit which receives at least one data signal, and performs a logic operation on the at least one data signal;
a first NMOS transistor which operates in response to the scan enable signal, and is connected to the logic operation circuit in parallel; and
a second NMOS transistor which forms a discharge path of the first node together with at least one of the logic operation circuit and the first NMOS transistor, in response to the first pulse signal.

20. A semiconductor device comprising a flip-flop having:
a first pulse signal generator which generates a first pulse signal in response to a scan enable signal and an inversed scan input signal;
a second pulse signal generator which generates a second pulse signal in response to the scan enable signal and a scan input signal;
a signal transmitter which receives a data signal and transmits the data signal to a first node in response to either one of the first pulse signal and the second pulse signal; and
a signal latch unit which receives the data signal transmitted to the first node, and latches and outputs the data signal in response to another one of the first pulse signal and the second pulse signal.

* * * * *